(12) United States Patent
Lee

(10) Patent No.: US 11,569,280 B2
(45) Date of Patent: Jan. 31, 2023

(54) IMAGE SENSING DEVICE

(71) Applicant: SK hynix Inc., Icheon-si (KR)

(72) Inventor: Kyoung In Lee, Icheon-si (KR)

(73) Assignee: SK HYNIX INC.

( * ) Notice: Subject to any disclaimer, the term of this patent is extended or adjusted under 35 U.S.C. 154(b) by 261 days.

(21) Appl. No.: 16/986,849

(22) Filed: Aug. 6, 2020

(65) Prior Publication Data
US 2021/0305296 A1 Sep. 30, 2021

(30) Foreign Application Priority Data

Mar. 31, 2020 (KR) .................. 10-2020-0039214

(51) Int. Cl.
*H01L 27/146* (2006.01)
*H04N 5/374* (2011.01)

(52) U.S. Cl.
CPC .. *H01L 27/14612* (2013.01); *H01L 27/14607* (2013.01); *H01L 27/14643* (2013.01); *H04N 5/374* (2013.01); *H01L 27/1464* (2013.01)

(58) Field of Classification Search
CPC ......... H01L 27/14612; H01L 27/14607; H01L 27/14643; H01L 27/1464; H04N 5/374
See application file for complete search history.

(56) References Cited

U.S. PATENT DOCUMENTS

| 9,537,028 B2 | 1/2017 | De Munck et al. |
| 2019/0019824 A1* | 1/2019 | Tanaka .............. H01L 27/14689 |
| 2020/0137325 A1* | 4/2020 | Mori .................. H04N 5/37452 |

FOREIGN PATENT DOCUMENTS

KR 10-2015-0046898 A 5/2015

* cited by examiner

*Primary Examiner* — Thanh Luu
(74) *Attorney, Agent, or Firm* — Perkins Coie LLP

(57) ABSTRACT

An image sensing device includes a first impurity region, a second impurity region, a floating diffusion region, and a transfer gate. The first impurity region is disposed in a semiconductor substrate and includes impurities with a first doping polarity, and the first impurity region generates photocharges by performing photoelectric conversion in response to incident light. The second impurity region is disposed over the first impurity region and has impurities with a second doping polarity different from the first doping polarity, and the second impurity region contacts with on some portions of the first impurity region. The floating diffusion region disposed over the second impurity region. The transfer gate couples to the floating diffusion region and transmits photocharges generated by the first impurity region to the floating diffusion region. The first impurity region is arranged not in contact with the transfer gate.

20 Claims, 10 Drawing Sheets

IMAGE SENSING DEVICE

CROSS-REFERENCE TO RELATED APPLICATION

This patent document claims the priority and benefits of Korean patent application No. 10-2020-0039214, filed on Mar. 31, 2020, which is incorporated by reference in its entirety as part of the disclosure of this patent document.

TECHNICAL FIELD

The technology and implementations disclosed in this patent document generally relate to an image sensing device.

BACKGROUND

An image sensor is a device (or an element) for converting an optical image into electrical signals. With the recent development of automotive, medical, computer and communication industries, the demand for higher-performance image sensors is increasing in various devices such as digital cameras, camcorders, personal communication systems (PCSs), game consoles, surveillance cameras, medical micro-cameras, robots, etc.

SUMMARY

Various embodiments of the disclosed technology relate to an image sensing device for improving operational characteristics thereof.

In accordance with an embodiment of the disclosed technology, an imaging sensing device is provided to include: a first impurity region disposed in a semiconductor substrate including a first surface and a second surface opposite to the first surface, and configured to generate photocharges by performing photoelectric conversion of incident light received through the first surface; a second impurity region formed to have impurities different from those of the first impurity region, and disposed over the first impurity region; a floating diffusion (FD) region formed over the second surface of the semiconductor substrate; and a transfer gate configured to transmit photocharges generated by the first impurity region to the floating diffusion (FD) region, wherein the first impurity region is not in contact with the transfer gate, and some regions of a top surface of the first impurity region are disposed to contact the second impurity region.

In another aspect, an image sensing device may include a first impurity region disposed in a semiconductor substrate and including impurities with a first doping polarity, the first impurity region configured to generate photocharges by performing photoelectric conversion in response to incident light, a second impurity region disposed over the first impurity region and having impurities with a second doping polarity different from the first doping polarity, the second impurity region in contact with on some portions of the first impurity region, a floating diffusion region disposed over the second impurity region and configured to store the photocharges, and a transfer gate coupled to the floating diffusion region and configured to transmit the photocharges generated by the first impurity region to the floating diffusion region. The first impurity region may be arrange not in contact with the transfer gate.

In accordance with another embodiment of the disclosed technology, an image sensing device may include a pixel array including a plurality of unit pixels and configured to provide an electrical signal corresponding to an incident light received by the pixel array. Each of the plurality of unit pixels may include a first impurity region having first-type impurities, and configured to generate photocharges through a photoelectric conversion of the incident light, and a second impurity region having second-type impurities different from the first-type impurities, and disposed over the first impurity region. The first impurity region may have a top surface having a portion distanced from the second impurity region.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device that substantially addresses one or more issues due to limitations and disadvantages of the related art. Some implementations of the disclosed technology suggest designs of an image sensing device having a new structure to improve operational characteristics thereof.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
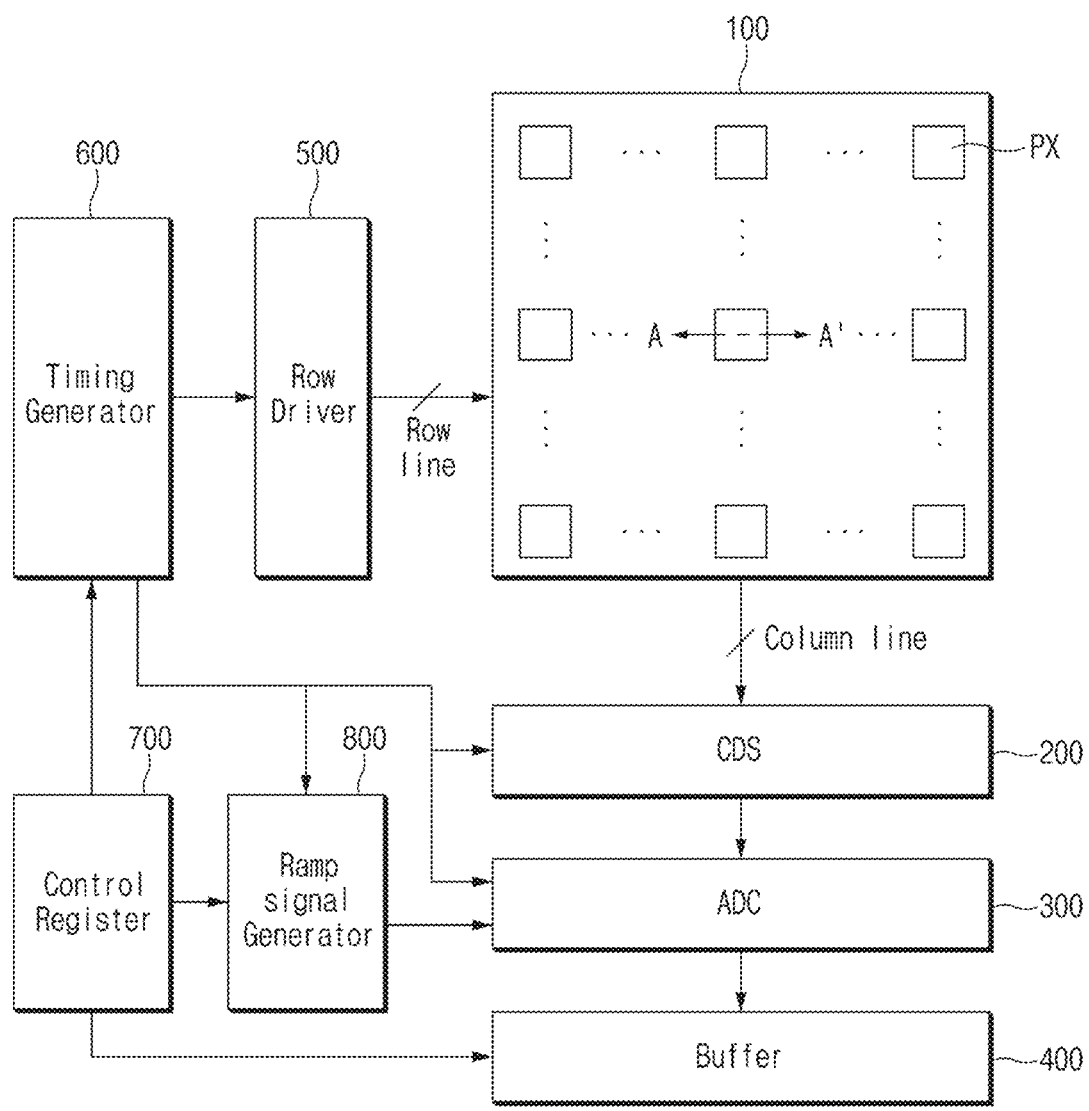
FIG. 1 is a block diagram illustrating an example of an image sensing device based on some implementations of the disclosed technology.

FIG. 1 is an example of a block diagram illustrating an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include unit pixels PXs consecutively arranged in a two-dimensional (2D) structure in which unit pixels are arranged in a first direction and a second direction perpendicular to the first direction. Each of the unit pixels PXs may convert incident light into an electrical signal to generate a pixel signal, and may output the pixel signal to the correlated double sampler (CDS) 200 through column lines. A substrate may include a semiconductor substrate that includes a first surface upon which light is incident and a second surface facing or opposite to the first surface. Each unit pixel PX may include a photoelectric conversion region formed in a substrate, and a recessed transfer gate for transmitting photocharges (electrons) generated in the photoelectric conversion region to a floating diffusion region. In this case, a bottom surface of the transfer gate may be formed not to contact the photoelectric conversion region. The photoelectric conversion region may include a distribution structure in which a high-density N-type impurity region and a low-density N-type impurity region are combined with each other. A P-type impurity region may be formed over the photoelectric conversion region. The P-type impurity region may act as a well region of pixel transistors, and may isolate the photoelectric conversion region and the floating diffusion region from each other. As described above, the photoelectric conversion region is formed in a combination structure a high-density impurity region and a low-density impurity region, resulting in an increase in transmission characteristics of photocharges. In addition, a junction breakdown voltage between the photoelectric conversion region which is an N-type impurity region and the P-type impurity region disposed over the photoelectric conversion region can be prevented from being deteriorated. The above-mentioned impurity distribution structure of the photoelectric conversion region will be described later.

The correlated double sampler (CDS) 200 may sample and hold electrical image signals received from the pixels PXs of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal based on a clock signal received from the timing generator 600 and a ramp signal received from the ramp signal generator 800, and may output a count value indicating the counted level transition time to the buffer 400.

The buffer 400 may store each of the digital signals received from the analog-to-digital converter (ADC) 300, may sense and amplify each of the digital signals, and may output each of the amplified digital signals. The buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may drive the pixel array 100 in units of a row line in response to an output signal of the timing generator 600. For example, the row driver 500 may generate a selection signal capable of selecting any one of the plurality of row lines.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal output to the buffer 400 based on a control signal received from the control register 700 and a timing signal received from the timing generator 600.

Figure 2:
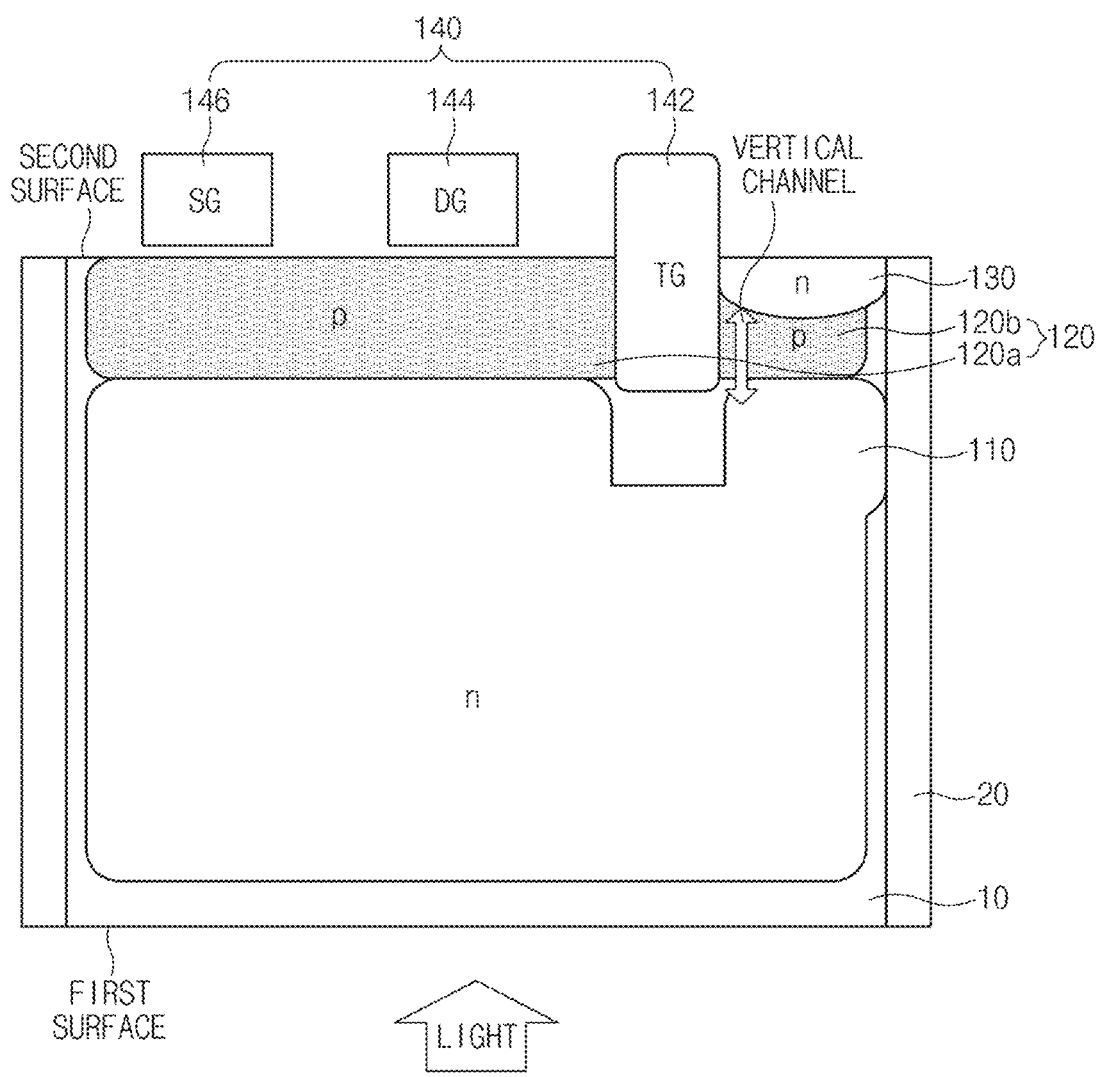
FIG. 2 is a cross-sectional view illustrating an example of a unit pixel taken along the line A-A' shown in FIG. 1 based on some implementations of the disclosed technology.

FIG. 2 is a cross-sectional view illustrating an example of the unit pixel (PX) taken along the line A-A' shown in FIG. 1 based on some implementations of the disclosed technology.

Referring to FIG. 2, the unit pixel PX may include a photoelectric conversion region 110, a well and isolation region 120, a floating diffusion region 130, and a plurality of pixel transistors 140.

The photosensing unit pixel PX shown in FIG. 2 is an example of a CMOS image sensor structured in a backside illumination (BSI) configuration by configuring the unit pixel PX such that an incident light first enters a first surface of the substrate 10 to reach the photoelectric conversion region 110 without encountering metal patterns (including conductive metal lines) for the photoelectric conversion region 110 and sensing circuitry that are formed over the second surface of the substrate 10 on the other side. Such metal patterns formed over the second surface of the substrate 10 may reflect or scatter incident light received by a CMOS image sensor and such reflected or scattered light, if not managed, may adversely affect the sensing performance or operation. The BSI configuration can avoid undesired scattering or reflection of the incident light before the incident light enters the photoelectric conversion region 110. This improves the optical sensing of the incident light and thus is advantageous. In some implementations, a lens array of lenses for receiving incident light to the CMOS image sensor may be formed on the first surface to focus the incident light onto different photoelectric conversion regions 110, respectively.

The photoelectric conversion region 110 may generate photocharges by performing photoelectric conversion of incident light received through a first surface of a semiconductor substrate 10. The photoelectric conversion region 110 can be implemented as a photodiode, a photo transistor, a photo gate, or other photosensitive circuitry capable of converting light into a pixel signal (e.g., a charge, a voltage or a current). The photoelectric conversion region 110 may include an N-type impurity region formed in the semiconductor substrate 10 of the unit pixel (PX) region defined by a device isolation layer 20.

The photoelectric conversion region 110 may be disposed below the well and isolation region 120 as shown in FIG. 2. The photoelectric conversion region 110 may have a top surface having a portion that is positioned relatively closer to the bottom surface of the photoelectric conversion region 110 and a remaining portion that is positioned at a relatively further away from the bottom surface of the photoelectric conversion region 110. The remaining portion of the top surface of the photoelectric conversion region 110 may protruding upward as compared to the portion of the top surface of the photoelectric conversion region 110 such that the remaining portion may be in contact with the well and isolation region 120. The portion of the top surface of the photoelectric conversion region 110 may be formed in a concave shape such that the portion is not in contact with the well and isolation region 120. For example, the portion of the top surface of the photoelectric conversion region 110 may be disposed below the transfer gate TG and spaced apart from the well and isolation region 120 by a predetermined distance. Thus, the portion of the top surface of the photoelectric conversion region 110 is not in contact with the well and isolation region 120. In some implementations, the portion of the top surface of the photoelectric conversion region 110, which is disposed below the transfer gate TG, may not contact the transfer gate TG. For example, the transfer gate TG may be formed in a manner that a bottom surface of the transfer gate TG is disposed at a lower level than a bottom surface of the well and isolation region 120. Such bottom surface of the transfer gate TG is disposed apart from the portion of the top surface of the photoelectric conversion region 110 disposed below the transfer gate TG. The portion of the top surface of the photoelectric conversion region 110 is not in contact with the bottom surface of the transfer gate TG.

The remaining portion of the top surface of the photoelectric conversion region 110 other than the portion disposed below the transfer gate TG may contact the bottom surface of the well and isolation region 120. For example, the photoelectric conversion region 110 and the well and isolation region 120 may be formed to have a PN junction structure in which the P-type impurity region and the N-type impurity region are in contact with each other, and the N-type impurity region 110 may be formed not to contact the transfer gate TG. The n-type impurity region 110 has a portion disposed below the floating diffusion region 130. The remaining portion of the n-type impurity region 110 may protrude upward as compared to the portion of the top surface under the transfer gate TG 142 such that the protruded region is in contact with the well and isolation region 120 and a channel region of the transfer gate TG. As a result, a path for transferring photocharges from the photoelectric conversion region 110 to the floating diffusion region 130 is formed and photocharges can flow from the photoelectric conversion region 110 to the floating diffusion region 130.

The photoelectric conversion region 110 may include different N-type impurity regions having different densities from one another. Alternatively, the photoelectric conversion region 110 may include a structure in which N-type impurities at different locations in the region 110 are distributed with a uniform impurity density.

The well and isolation region 120 may include at least one P-type impurity region. In the example of FIG. 2, the well and isolation region 120 includes a first p-type impurity region 120a and a second p-type impurity region 120b. The first P-type impurity region 120a may be formed to contact a second surface of the semiconductor substrate 10 that is opposite to a first surface of the semiconductor substrate 10. The second P-type impurity region 120b may be disposed below the floating diffusion region. The first and second P-type impurity regions 120a and 120b may be formed by implantation of P-type impurities that are implanted to a predetermined depth from the second surface. The well and isolation region 120 may be used as a P-well region of pixel transistors formed in the unit pixel PX. In some implementations, the second P-type impurity region 120b may allow the photoelectric conversion region 110 and the floating diffusion region 130 to be isolated from each other in a situation in which a transfer control signal is not applied to the transfer gate TG. The well and isolation region 120 may include P-type impurities that are higher in density (or concentration) than other P-type impurities contained in the semiconductor substrate 10. Alternatively, the well and isolation region 120 may also be formed of or include P-type impurities that are implanted into the substrate 10. The floating diffusion region 130 may temporarily store photocharges (electrons) that are transferred from the photoelectric conversion region 110 by the transfer gate TG. The floating diffusion region 130 may include an impurity region that is in contact with the second surface of the semiconductor substrate 10 and is formed by implantation of N-type impurities that are implanted to a predetermined depth from the second surface. The floating diffusion region 130 may be disposed over the well and isolation region 120. For example, the floating diffusion region 130 may be electrically isolated from the photoelectric conversion region 110 by the well and isolation region 120.

The pixel transistors 140 may include a transfer transistor 142, a source follower transistor 144, and a selection transistor 146.

The transfer transistor 142 may transmit photocharges (electrons) generated by the photoelectric conversion region 110 to the floating diffusion region 130 in response to a transfer control signal. The transfer transistor 142 may include a transfer gate TG formed between the photoelectric conversion region 110 and the floating diffusion region 130. Thus, the photoelectric conversion region and the floating diffusion region are used as source/drain regions of the transfer transistor 142.

The transfer gate TG may include a recess gate structure in which at least some regions are buried in the semiconductor substrate 10. For example, the transfer transistor 142 may be a vertical-channel transfer transistor that forms a vertical channel between the photoelectric conversion region 110 and the floating diffusion region 130. In addition, the transfer gate TG may be formed to have a predetermined length in a manner that the transfer gate TG can vertically pass through the well and isolation region 120. For example, a lower region of the transfer gate TG may protrude downward more than the bottom surface of the well and isolation region 120.

As described above, in order to increase the amount of electrons transferred from the photoelectric conversion region to the floating diffusion region when the transfer gate TG is formed in a recess gate structure having a vertical channel, there is a need for N-type impurities of the photoelectric conversion region to increase in density.

However, when high-density N-type impurities are formed to contact the channel region of the transfer gate, transmission (Tx) characteristics may be deteriorated by a potential pocket phenomenon. For example, when the transfer transistor is turned on, a potential pocket may be formed at a specific portion where the channel region of the transfer gate is coupled to the N-type impurity region of the photoelectric conversion region. If the potential pocket is formed, some of photocharges generated by the photoelectric conversion region may be accumulated in the potential pocket without being transferred to the floating diffusion region. Thus, some of the photocharges may remain in a lower portion of the transfer gate.

As described above, if the transfer transistor is turned off when the photocharges are accumulated in the potential pocket, there may occur a spill-back phenomenon by which all or some of the photocharges accumulated in the potential pocket can move back into the photoelectric conversion region. Transmission (Tx) characteristic deterioration caused by such potential pocket may become more severe in proportion to the increasing density of N-type impurities contacting the transfer gate.

Therefore, in some implementations, the photoelectric conversion region 110 acting as the N-type impurity region may be formed not to contact the transfer gate TG, such that transmission (Tx) characteristic deterioration caused by the potential pocket can be minimized.

The source follower transistor 144 may generate a signal corresponding to the amount of charges stored in the floating diffusion region 130 and output the signal to the selection transistor 146. The selection transistor 146 may receive an output signal of the source follower transistor 144, and may output the received signal through a column line based on a selection signal. The selection transistor 144 and the source follower transistor 146 may be formed over the photoelectric conversion region 110 in a manner that the transistor 146 can vertically overlap with the photoelectric conversion region 110.

Figure 3:
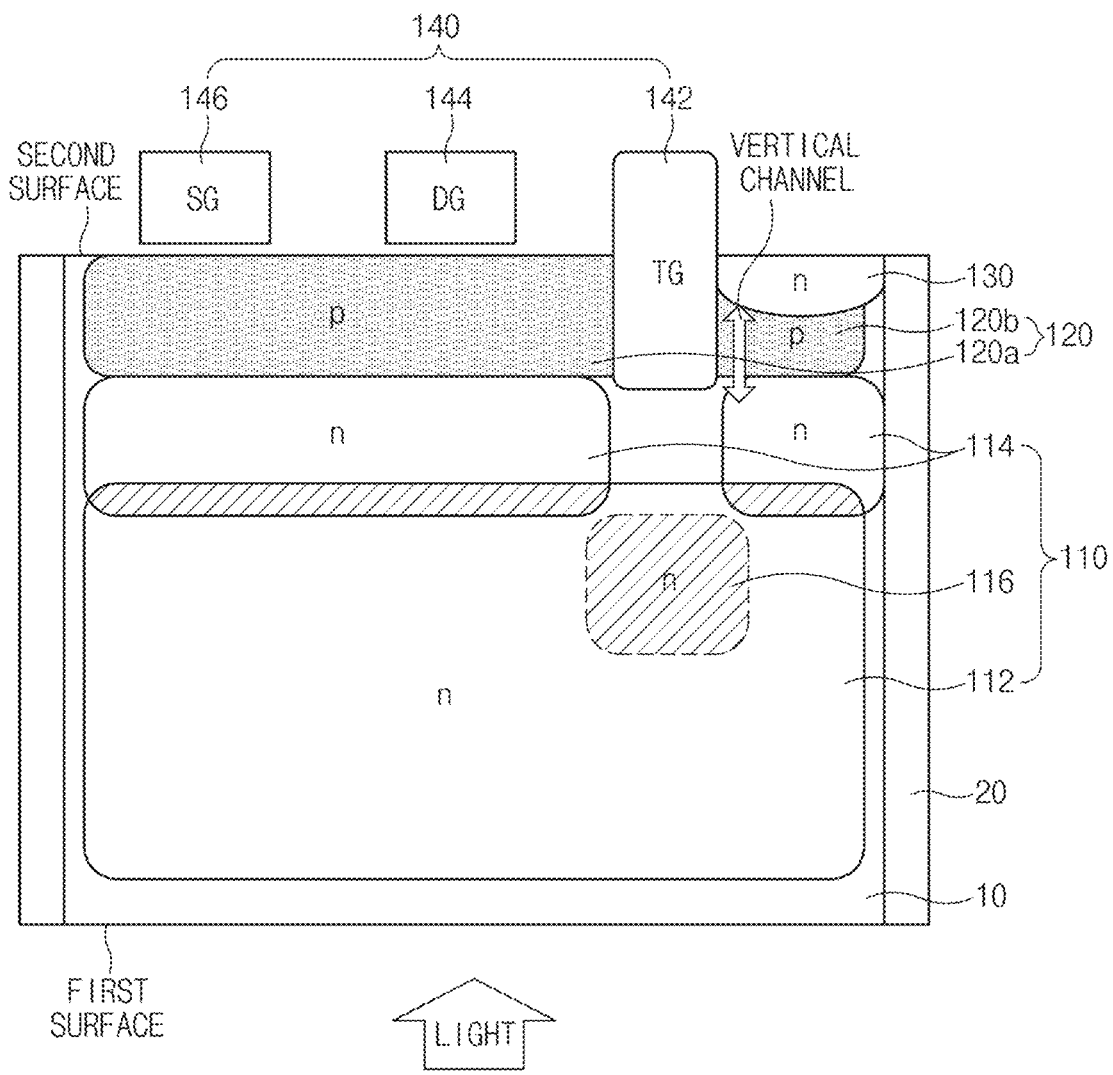
FIG. 3 is a cross-sectional view illustrating that an N-type photoelectric conversion region shown in FIG. 2 is formed of a combination of N-type impurity regions having different densities based on some implementations of the disclosed technology.

FIG. 3 is a cross-sectional view illustrating that the photoelectric conversion region shown in FIG. 2 is formed of a combination of N-type impurity regions having different densities based on some implementations of the disclosed technology.

Referring to FIG. 3, the photoelectric conversion region 110 may include a plurality of N-type impurity regions 112, 114, and 116 having different impurity densities.

The N-type impurity region 112 may be disposed below the well and isolation region 120 in the semiconductor substrate 10. In this case, the N-type impurity region 112 may be spaced apart from the well and isolation region 120 by a predetermined distance in a manner that the N-type impurity region 112 is not in contact with the well and isolation region 120. In addition, the N-type impurity region 112 may be formed not to contact the transfer gate TG (or a channel region of the transfer gate TG). Thus, the N-type impurity region 112 may be formed not to contact both the well and isolation region 120 and the transfer gate TG.

The N-type impurity region 114 may be disposed between the well and isolation region 120 and the N-type impurity region 112 in a manner that the N-type impurity region 114 is in contact with the well and isolation region 120. The N-type impurity region 114 may be formed not to contact the transfer gate TG. The N-type impurity region 114 has a region disposed below the floating diffusion region 130 and contacting the channel region of the transfer gate TG, such that a transfer path of photocharges flowing from the photoelectric conversion region 110 to the floating diffusion region 130 can be formed.

The N-type impurity regions 112 and 114 may also be formed in a manner that some parts (i.e., hatched regions shown in FIG. 3) of the N-type impurity regions 112 and 114 overlap with each other. For example, when the N-type impurity region 112 is first formed and the N-type impurity region 114 is formed later, some impurities may also be implanted into the N-type impurity region 112 during an impurity implantation process for forming the N-type impurity region 114. In this case, the region where the N-type impurity regions 112 and 114 overlap with each other may or may not be formed depending on an actual process. In the following descriptions, the N-type impurity region 114 may refer to a region disposed over the N-type impurity region 112 that does not overlap with the N-type impurity region 112.

Figure 4:
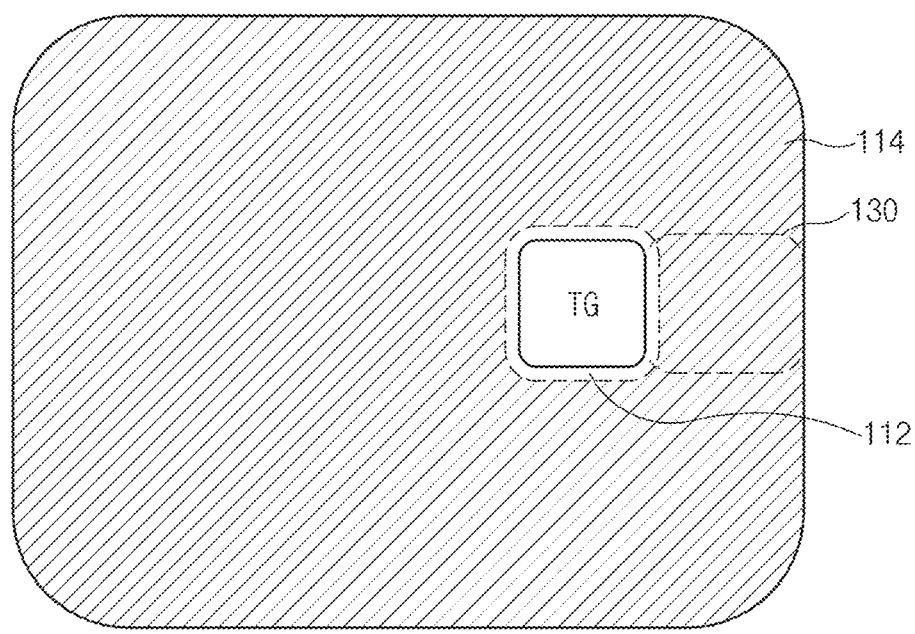
FIG. 4 is a plan view illustrating an example of a low-density N-type impurity region shown in FIG. 3 based on some implementations of the disclosed technology.

The N-type impurity region 114 may have an impurity density less than that of the N-type impurity region 112. Thus, the photoelectric conversion region 110 may include a stacked structure of the low-density N-type impurity region 114 contacting the well and isolation region 120 and the high-density N-type impurity region 112 not contacting the well and isolation region 120. Although FIG. 3 illustrates the N-type impurity region 114 shown as separate regions isolated from each other for convenience of description, the disclosed technology is not limited thereto and other implementations are also possible. For example, the N-type impurity region 114 may be formed to have a single ring-shape having an opening corresponding to a formation region of the transfer gate TG. FIG. 4 illustrates a plan view of an N-type impurity region 114 having a single ring-shaped region. The N-type impurity region 114 has an opening in which the transfer gate TG is formed.

The N-type impurity region 116 may be disposed in the N-type impurity region 112. The N-type impurity region 116 may be formed simultaneously with the N-type impurity region 114. For example, the N-type impurity region 116 may be formed when N-type impurities implanted simultaneously with the N-type impurity region 114 are implanted into the N-type impurity region 112. Therefore, the N-type impurity region 116 may have an impurity density higher than that of the N-type impurity region 112. The N-type impurity region 116 may be located at a region vertically overlapping with the transfer gate TG in the N-type impurity region 112. The N-type impurity region 116 may not be formed simultaneously with the N-type impurity region 114.

Effects of the impurity distribution structure of the photoelectric conversion region 110 shown in FIG. 3 are as follows.

In the impurity distribution structure of the photoelectric conversion region 110 shown in FIG. 2, the photoelectric conversion region 110 may be formed not to contact the transfer gate TG, such that the spill-back phenomenon caused by the potential pocket can be reduced irrespective of higher impurity density of the photoelectric conversion region 110, resulting in an increase in transmission (Tx) characteristics. However, when the impurity density of the photoelectric conversion region 110 increases, a difference in impurity density between the photoelectric conversion region 110 and the well and isolation region 120 may also increase, resulting in deterioration in breakdown voltage (BV) characteristics of the PN junction region.

Therefore, in some implementations, the photoelectric conversion region 110 may be divided into the upper N-type impurity region 114 contacting the well and isolation region 120 and the lower N-type impurity region 112 disposed below the upper N-type impurity region 114, such that the upper N-type impurity region 114 may act as the low-density impurity region 114 and the lower N-type impurity region 112 may act as the high-density impurity region 112. Thus, the photoelectric conversion region 110 may include a stacked structure of the high-density lower N-type impurity region 112 and the low-density upper N-type impurity region 114.

In the above-mentioned structure, the upper N-type impurity region 114 contacting the well and isolation region 120 is formed as the low-density impurity region and the lower N-type impurity region 112 can be formed as the high-density impurity region. For example, the upper N-type impurity region 114 is kept in a predetermined low-density state. As a result, although the lower N-type impurity region 112 is formed to have high density, an impurity density difference in the PN junction region between the photoelectric conversion region 110 and the well and isolation region 120 may not increase. Therefore, although the lower N-type impurity region 112 is formed to have high density, deterioration of breakdown voltage (BV) characteristics between the photoelectric conversion region 110 and the well and isolation region 120 can be prevented.

In addition, the low-density upper N-type impurity region 114 may not be formed below the transfer gate TG and the high-density lower N-type impurity region 112 may be exposed to the transfer gate TG, such that transmission (Tx) characteristics caused by the transfer gate TG can be improved by the high-density lower N-type impurity region 112.

FIGS. 5A to 5D are cross-sectional views illustrating examples of a method for forming the structure shown in FIG. 3 based on some implementations of the disclosed technology.

Figure 5A:
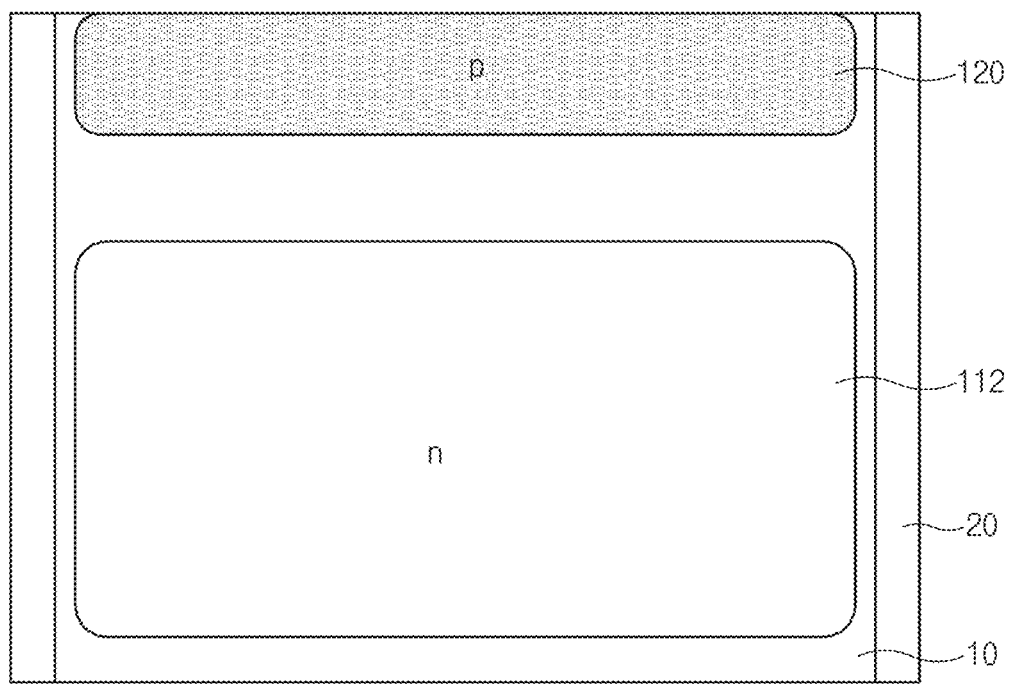
FIGS. 5A to 5D are cross-sectional views illustrating examples of a method for forming the structure shown in FIG. 3 based on some implementations of the disclosed technology.

Referring to FIG. 5A, N-type impurities may be implanted into a lower region of the semiconductor substrate 10 including a first surface and a second surface facing or opposite to the first surface, such that the high-density lower N-type impurity region 112 can be formed. For example, high-density N-type impurities may be implanted into the semiconductor substrate 10 through the second surface of the semiconductor substrate 10, such that the lower N-type impurity region 112 can be formed in the lower region of the semiconductor substrate 10.

Thereafter, P-type impurities may be implanted into the semiconductor substrate 10 through the second surface of the semiconductor substrate 10, such that the P-type impurity region 120 having a predetermined depth from the second surface while being in contact with the second surface can be formed. The P-type impurity region 120 may be spaced apart from the lower N-type impurity region 112 by a predetermined distance.

Subsequently, after a trench defining the pixel region (PX) is formed by etching of the semiconductor substrate 10, an insulation layer is formed to fill the trench, resulting in formation of a device isolation layer 20. The device isolation layer 20 may include a Deep Trench Isolation (DTI) structure, and may be formed to penetrate the semiconductor substrate 10.

Figure 5B:
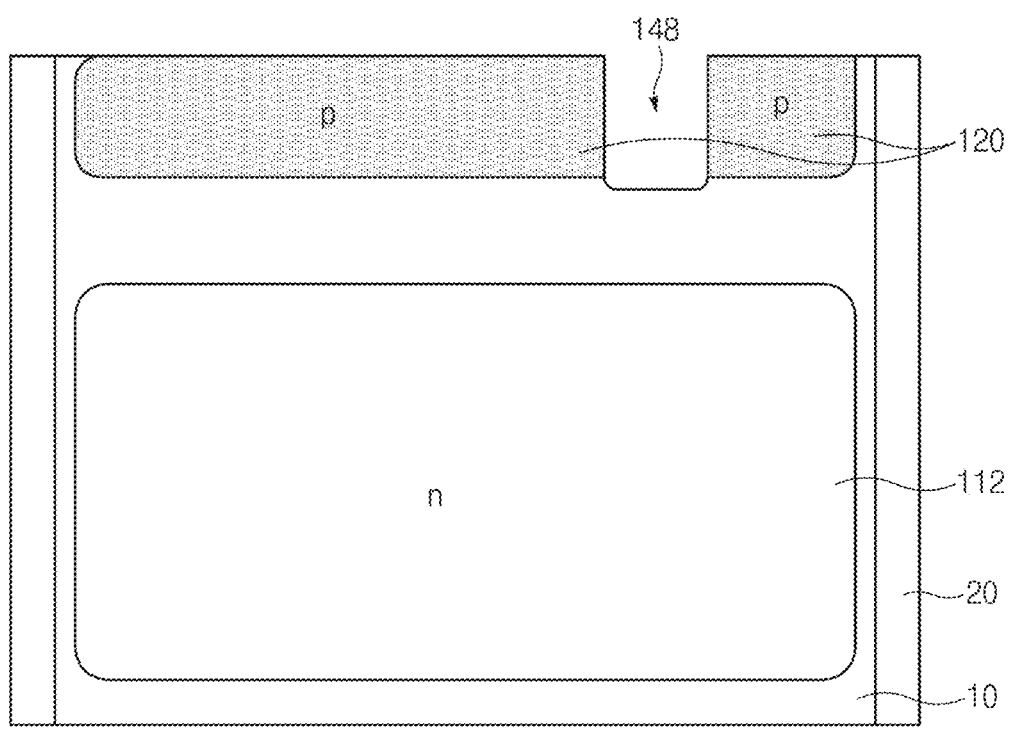

Referring to FIG. 5B, a specific region to be used as a formation region of the transfer gate TG may be etched to a predetermined depth at the second surface of the semiconductor substrate 10, resulting in formation of a trench 148 (hereinafter referred to as a transfer-gate trench) for the transfer gate.

The transfer-gate trench 148 may be formed to penetrate the P-type impurity region 120, and a bottom surface of the transfer-gate trench 148 may be spaced apart from the lower N-type impurity region 112 by a predetermined distance without contacting the lower N-type impurity region 112. For example, the transfer-gate trench 148 may be formed to a predetermined depth by which the bottom surface of the transfer-gate trench 148 can be disposed between the P-type impurity region 120 and the lower N-type impurity region 112.

Figure 5C:
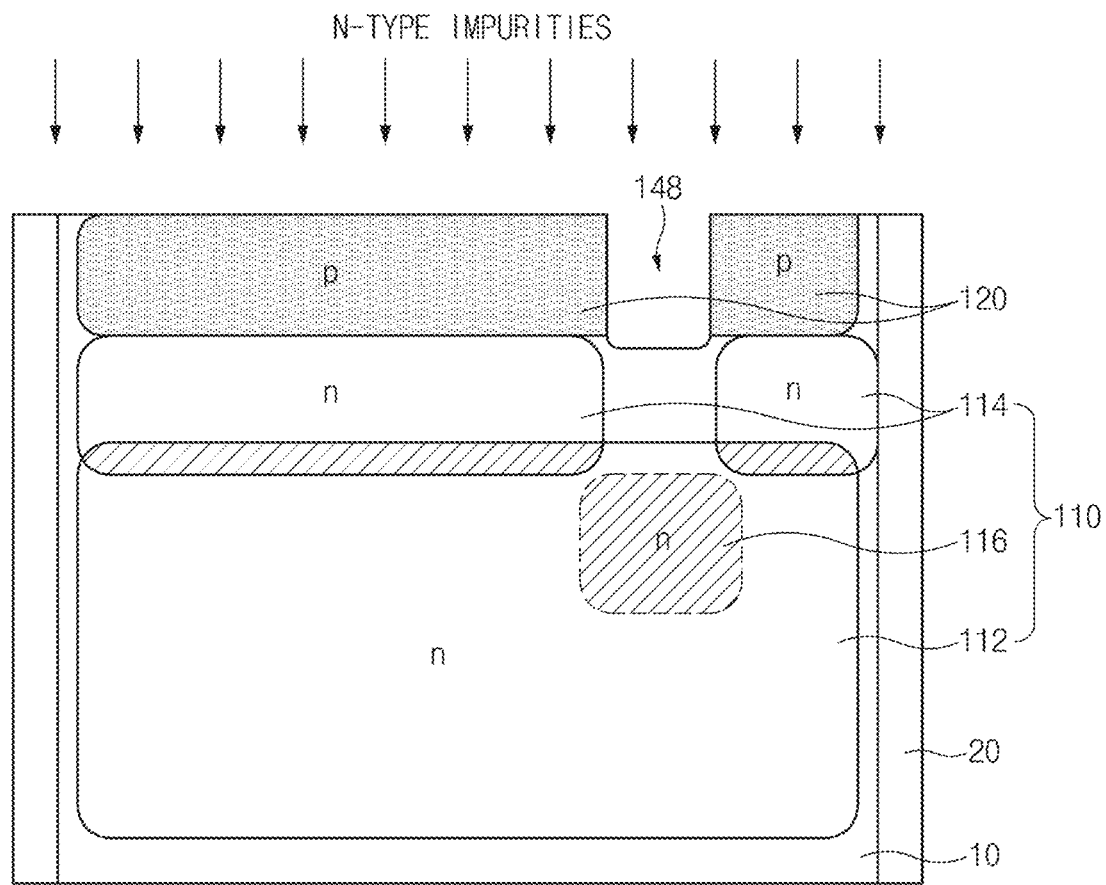

Referring to FIG. 5C, the N-type impurity region 114 may be formed between the P-type impurity region 120 and the lower N-type impurity region 112 by implanting N-type impurities through the second surface of the semiconductor substrate 10, such that the N-type impurity region 116 can be formed in the lower N-type impurity region 112.

In this case, the implanted N-type impurities may be lower in density than other N-type impurities that are implanted in the process for forming the lower N-type impurity region 112. In other words, the upper N-type impurity region 114 may be lower in impurity density than the lower N-type impurity region 112.

However, during the process for implanting N-type impurities, some N-type impurities implanted into the semiconductor substrate 10 through the transfer-gate trench 148 may be implanted into the semiconductor substrate 10 more deeply than other N-type impurities (which are not implanted into the semiconductor substrate 10 through the transfer-gate trench 148) to a predetermined depth corresponding to the depth of the trench 148, such that the N-type impurities can be implanted into the lower N-type impurity region 112. In other words, the N-type impurity region 116 may be formed in the lower N-type impurity region 112, N-type impurities may be additionally implanted into the N-type impurity region 112, such that the N-type impurity region 116 may be higher in impurity density than the lower N-type impurity region 112.

Figure 5D:
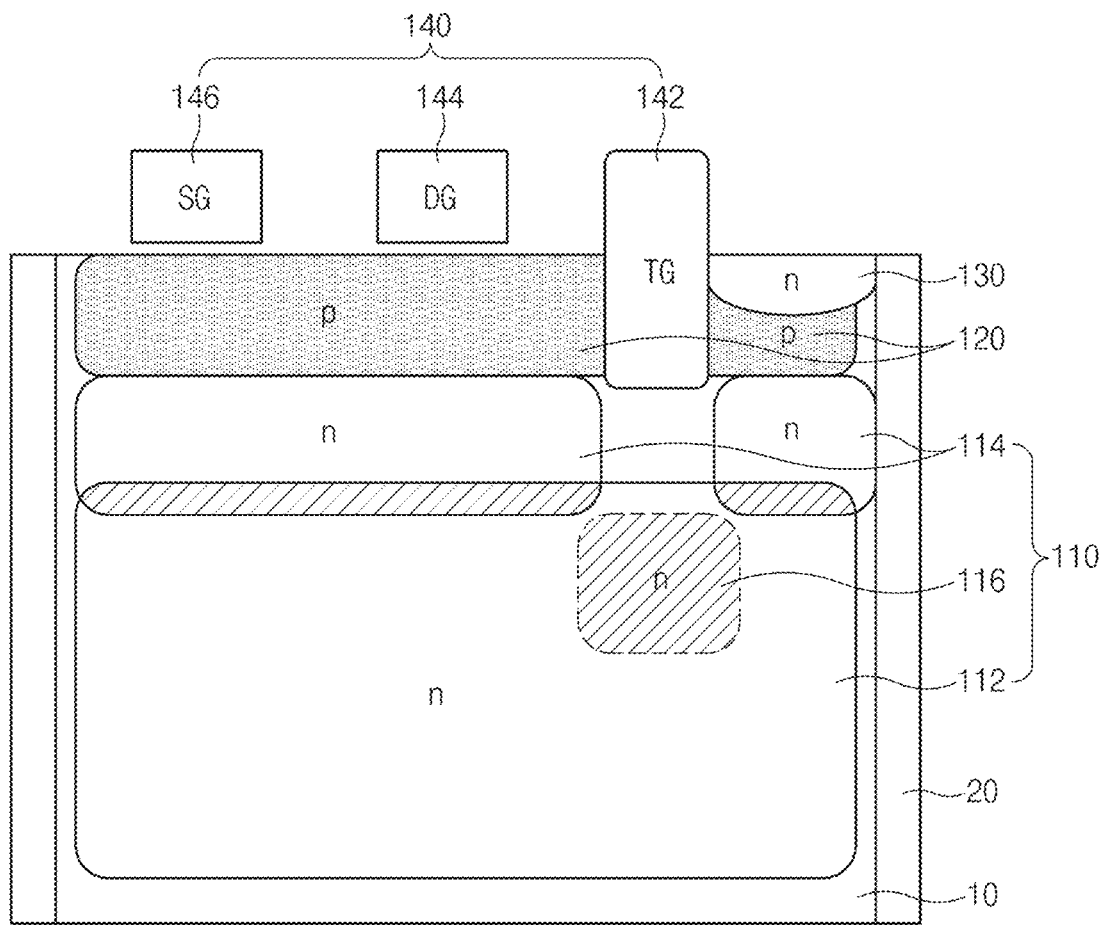

Referring to FIG. 5D, a gate insulation layer and a gate-purposed conductive layer (i.e., a gate conductive layer) are sequentially formed over the second surface and in the transfer-gate trench 148, and are then patterned, such that pixel transistors 142, 144, and 146 can be formed.

In addition, N-type impurities may be implanted into a region to be used as the floating diffusion region in the P-type impurity region 120, such that the floating diffusion region 130 can be formed at one side of the transfer gate TG.

Figure 6:
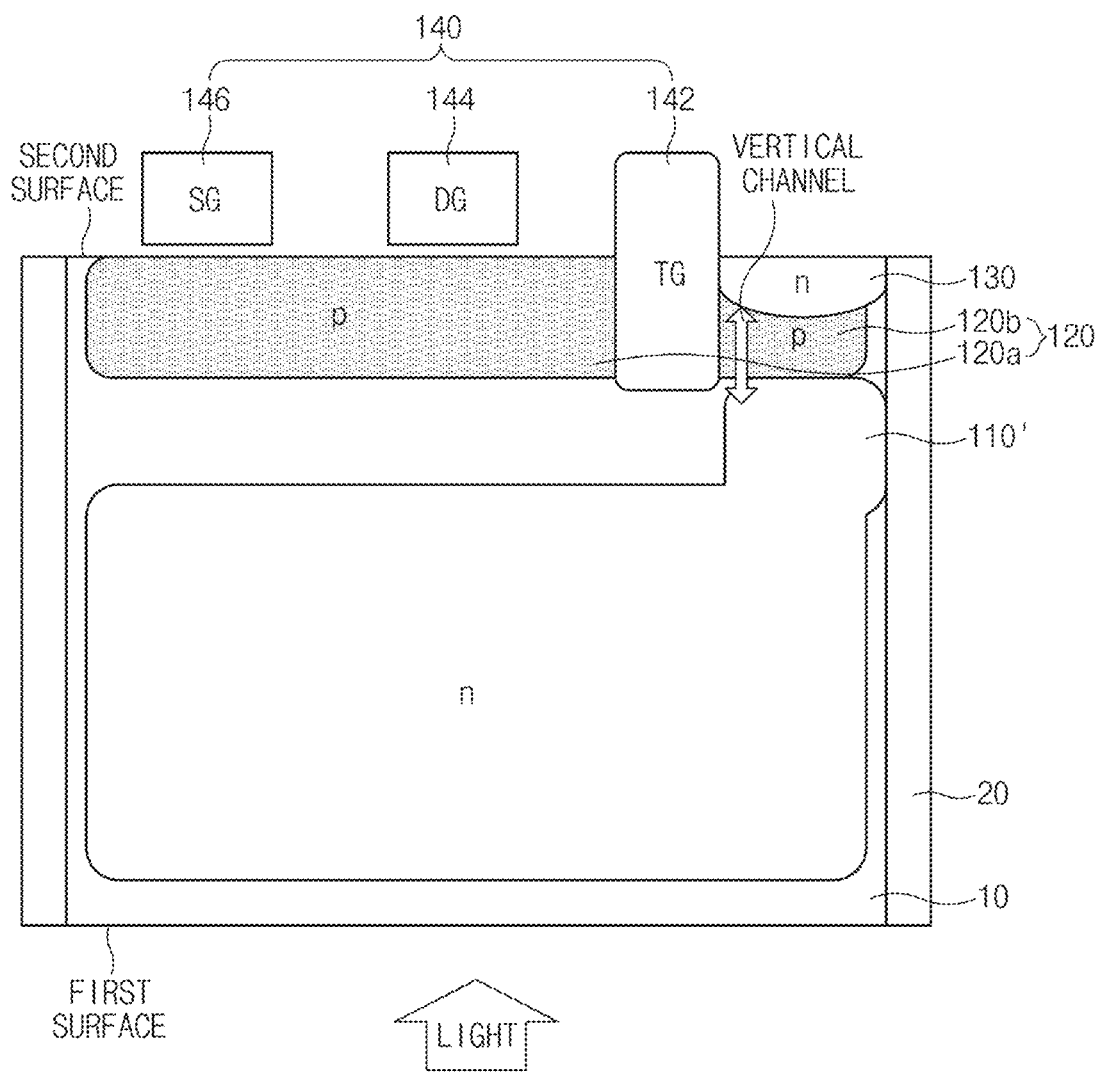
FIG. 6 is a cross-sectional view illustrating an example of a unit pixel taken based on some other implementations of the disclosed technology.
Figure 7:
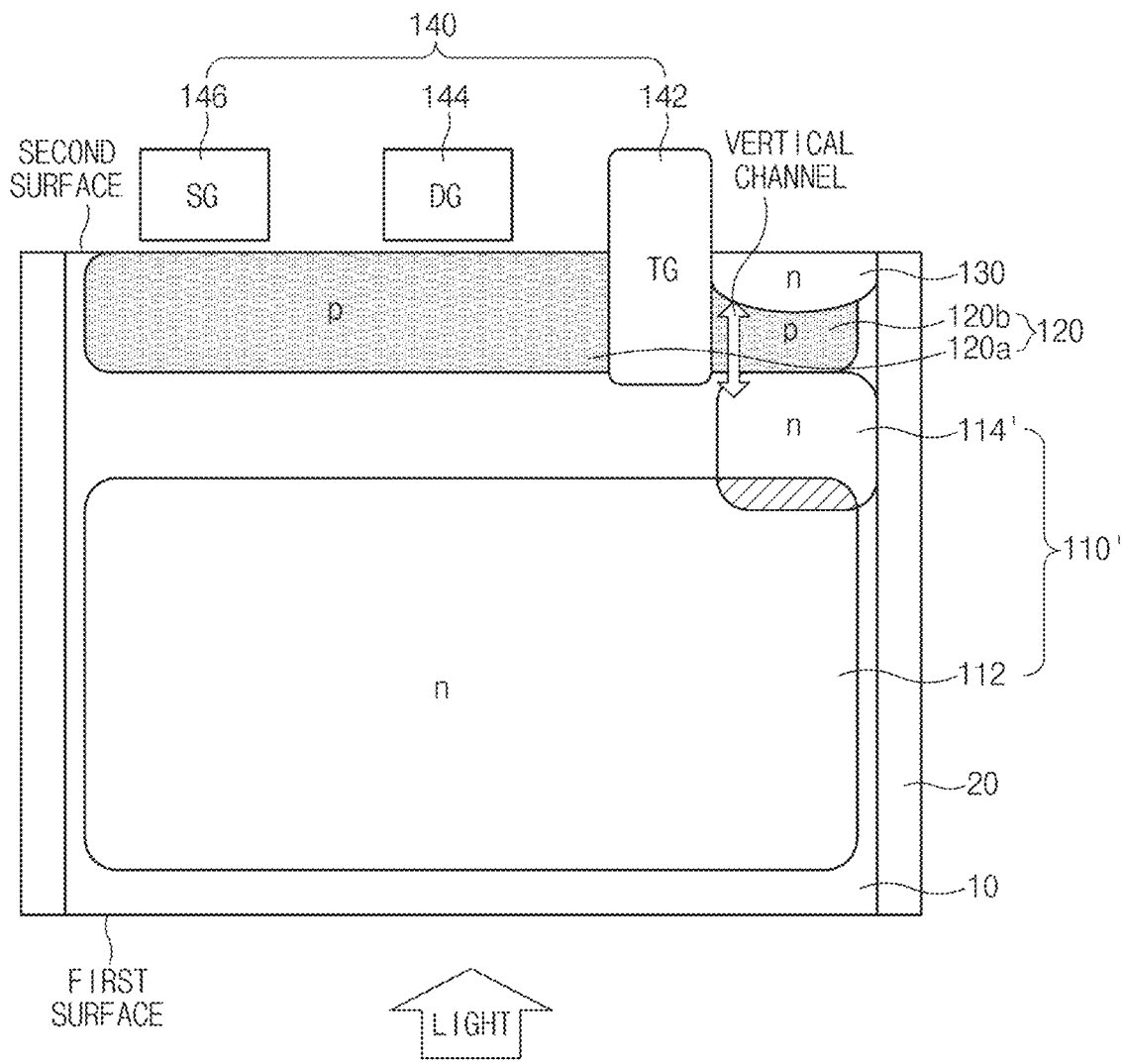
FIG. 7 is a cross-sectional view illustrating that an N-type photoelectric conversion region shown in FIG. 6 is formed of a combination of N-type impurity regions having different densities based on some implementations of the disclosed technology.

FIG. 6 is a cross-sectional view illustrating an example of the unit pixel taken based on some other implementations of the disclosed technology. FIG. 7 is a cross-sectional view illustrating that the photoelectric conversion region shown in FIG. 6 is formed of a combination of N-type impurity regions having different densities.

In FIGS. 6 and 7, the same constituent elements as in FIGS. 2 and 3 are denoted by the same reference numbers, and as such a detailed description thereof will herein be omitted for convenience of description.

Referring to FIGS. 6 and 7, a photoelectric conversion region 110' may be formed to contact the well and isolation region 120 only below the floating diffusion region 130 in a different way from FIGS. 2 and 3.

For example, the photoelectric conversion region 110' may include a high-density lower N-type impurity region 112 and a low-density upper N-type impurity region 114'. The high-density lower N-type impurity region 112 may be disposed below the well and isolation region 120 while being spaced apart from the well and isolation region 120 by a predetermined distance in a manner that the high-density lower N-type impurity region 112 is not in contact with the well and isolation region 120 and the transfer gate TG. The low-density upper N-type impurity region 114' may be formed below the floating diffusion region 130 in a manner that the low-density upper N-type impurity region 114' is in contact with the well and isolation region 120. Whereas the low-density upper N-type impurity region 114' is formed not to contact the transfer gate TG, the low-density upper N-type impurity region 114' is formed to contact the channel region of the transfer gate TG, such that a transfer path of photocharges flowing from the photoelectric conversion region 110 to the floating diffusion region 130 can be formed.

As is apparent from the above description, the image sensing device based on some implementations of the disclosed technology can improve transmission (Tx) characteristics of photocharges generated in a photoelectric conversion region.

In addition, the image sensing device based on some implementations of the disclosed technology can prevent breakdown voltage (BV) characteristics in the photoelectric conversion region from being deteriorated.

Those skilled in the art will appreciate that the embodiments may be carried out in other specific ways than those set forth herein. The above embodiments are therefore to be construed in all aspects as illustrative and not restrictive. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device, comprising:
a first impurity region disposed in a semiconductor substrate and including impurities with a first doping polarity, the first impurity region configured to generate photocharges by performing photoelectric conversion in response to incident light;
a second impurity region disposed over the first impurity region and having impurities with a second doping polarity different from the first doping polarity, the second impurity region in contact with on some portions of the first impurity region;
a floating diffusion region disposed over the second impurity region and configured to store the photocharges; and
a transfer gate coupled to the floating diffusion region and configured to transmit the photocharges generated by the first impurity region to the floating diffusion region,
wherein the first impurity region is arranged not in contact with the transfer gate,
wherein the first impurity region includes:
a lower impurity region disposed to be spaced apart from the second impurity region by a predetermined distance; and
an upper impurity region disposed between the lower impurity region and the second impurity region to contact with the lower impurity region and the second impurity region,
wherein the upper impurity region has an opening to expose the lower impurity region, the opening located to vertically overlap the transfer gate.

2. The image sensing device according to claim 1, wherein:
the first impurity region is formed to contact the second impurity region in a region that is disposed below the floating diffusion region.

3. The image sensing device according to claim 1, wherein:
the first impurity region includes a portion disposed below the transfer gate and is spaced apart from a bottom surface of the second impurity region by a predetermined distance.

4. The image sensing device according to claim 1, wherein:
the first impurity region includes a plurality of impurity regions having different impurity densities from each other.

5. The image sensing device according to claim 1, wherein
the lower impurity region has a first density and
the upper impurity region has a second density lower than the first density.

6. The image sensing device according to claim 1, wherein:
the upper impurity region has a ring shape having the opening.

7. The image sensing device according to claim 5, further comprising:
a third impurity region disposed in the lower impurity region, and having a third density higher than the first density.

8. The image sensing device according to claim 7, wherein:
the third impurity region is disposed to vertically overlap with the transfer gate.

9. The image sensing device according to claim 1, wherein:
the upper impurity region is located under the floating diffusion region.

10. The image sensing device according to claim 1, wherein the transfer gate has a portion buried in the semiconductor substrate.

11. The image sensing device according to claim 10, wherein:
a distance between the portion of the transfer gate and a top surface of the first impurity region is shorter than a distance between a bottom surface of the second impurity region and the top surface of the first impurity region.

12. The image sensing device according to claim 1, further comprising:
a source follower transistor configured to output a signal corresponding to an amount of the photocharges stored in the floating diffusion region; and
a selection transistor configured to transmit an output signal of the source follower transistor to a column line based on a selection signal,
wherein the source follower transistor and the selection transistor are disposed over the first impurity region such that the source follower transistor and the selection transistor vertically overlap with the first impurity region.

13. An image sensing device, comprising:
a pixel array including a plurality of unit pixels and configured to provide an electrical signal corresponding to an incident light received by the pixel array,
wherein each of the plurality of unit pixels includes:
a first impurity region having first-type impurities, and configured to generate photocharges through a photoelectric conversion of the incident light; and
a second impurity region having second-type impurities different from the first-type impurities and disposed over the first impurity region, wherein the first impurity region has a top surface having a portion distanced from the second impurity region, wherein the first impurity region includes:

a lower impurity region disposed to be spaced apart from the second impurity region by a predetermined distance; and an upper impurity region disposed between the lower impurity region and the second impurity region to contact with the lower impurity region and the second impurity region, wherein the upper impurity region has a ring-shape having an opening to partially expose the lower impurity region.

14. The image sensing device according to claim 13, wherein:

the first impurity region includes a plurality of impurity regions having different impurity densities from each other.

15. The image sensing device according to claim 13, wherein the lower impurity region has a first density and the upper impurity region has a second density lower than the first density.

16. The image sensing device according to claim 15, further comprising:

a third impurity region disposed in the lower impurity region, and having a third density higher than the first density.

17. The image sensing device according to claim 16, wherein:

the third impurity region is disposed to vertically overlap with the opening.

18. An image sensing device, comprising:

a first impurity region disposed in a semiconductor substrate and including impurities with a first doping polarity, the first impurity region configured to generate photocharges by performing photoelectric conversion in response to incident light;

a second impurity region disposed over the first impurity region and having impurities with a second doping polarity different from the first doping polarity, the second impurity region in contact with on some portions of the first impurity region;

a floating diffusion region disposed over the second impurity region and configured to store the photocharges; and a transfer gate coupled to the floating diffusion region and configured to transmit the photocharges generated by the first impurity region to the floating diffusion region, wherein the first impurity region is arranged not in contact with the transfer gate, wherein the first impurity region comprises:

a lower impurity region having a first density, and disposed to be spaced apart from the second impurity region by a predetermined distance; and an upper impurity region having a second density lower than the first density, and disposed between the lower impurity region and the second impurity region, wherein the upper impurity region is in contact with the lower impurity region and the second impurity region, and wherein the upper impurity region is located under the floating diffusion region.

19. The image sensing device of claim 18, wherein the upper impurity region has an opening to expose the lower impurity region, the opening located to vertically overlap the transfer gate.

20. The image sensing device of claim 18, wherein:

the first impurity region is formed to contact the second impurity region in a region that is disposed below the floating diffusion region.

* * * * *